United States Patent [19]
Merritt

[11] Patent Number: 6,118,711
[45] Date of Patent: Sep. 12, 2000

[54] APPARATUS FOR TESTING REDUNDANT ELEMENTS IN A PACKAGED SEMICONDUCTOR MEMORY DEVICE

[75] Inventor: Todd A. Merritt, Boise, Id.

[73] Assignee: Micron Technology, Inc., Boise, Id.

[21] Appl. No.: 09/227,483

[22] Filed: Jan. 7, 1999

Related U.S. Application Data

[62] Division of application No. 08/924,483, Aug. 18, 1997, Pat. No. 5,978,289, which is a division of application No. 08/633,133, Apr. 16, 1996, Pat. No. 5,781,486.

[51] Int. Cl.$^7$ .................................................. G11C 7/00
[52] U.S. Cl. ........................................... 365/200; 365/201
[58] Field of Search ..................................... 365/200, 201, 365/189.01, 230.01

[56] References Cited

U.S. PATENT DOCUMENTS

| | | | |
|---|---|---|---|
| 4,573,146 | 2/1986 | Graham et al. | 365/200 |
| 4,586,170 | 4/1986 | O'Toole et al. | 365/200 |
| 5,124,949 | 6/1992 | Morigami | 365/210 |
| 5,134,587 | 7/1992 | Steele | 365/200 |
| 5,212,442 | 5/1993 | O'Toole et al. | 324/58 R |
| 5,257,229 | 10/1993 | McClure et al. | 365/200 |
| 5,295,102 | 3/1994 | McClure | 365/200 |
| 5,319,599 | 6/1994 | Kato | 365/200 |
| 5,355,338 | 10/1994 | Han | 365/200 |
| 5,355,340 | 10/1994 | Coker et al. | 365/200 |
| 5,416,740 | 5/1995 | Fujita et al. | 365/200 |
| 5,434,438 | 7/1995 | Kuo | 257/300 |
| 5,455,798 | 10/1995 | McClure | 365/200 |
| 5,466,888 | 11/1995 | Beng et al. | 174/522 |
| 5,469,401 | 11/1995 | Gillingham | 365/230.06 |
| 5,491,664 | 2/1996 | Phelan | 365/200 |
| 5,511,029 | 4/1996 | Sawada et al. | 365/200 |
| 5,528,539 | 6/1996 | Ong et al. | 365/200 |
| 5,535,161 | 7/1996 | Kato | 365/200 |
| 5,544,106 | 8/1996 | Koike | 365/200 |
| 5,559,741 | 9/1996 | Sobue | 365/200 |
| 5,563,832 | 10/1996 | Kagami | 365/200 |
| 5,574,729 | 11/1996 | Kinoshita et al. | 371/10.3 |
| 5,577,050 | 11/1996 | Bair et al. | 371/10.2 |
| 5,590,075 | 12/1996 | Mazzali | 365/185.22 |
| 5,602,786 | 2/1997 | Pascucci et al. | 365/200 |
| 5,612,918 | 3/1997 | McClure | 365/200 |
| 5,617,365 | 4/1997 | Horiguchi et al. | 365/200 |
| 5,619,462 | 4/1997 | McClure | 365/200 |
| 5,652,725 | 7/1997 | Suma et al. | 365/200 |
| 5,659,509 | 8/1997 | Golla et al. | 365/200 |
| 5,680,354 | 10/1997 | Kawagoe | 365/200 |
| 5,691,945 | 11/1997 | Liou et al. | 365/200 |
| 5,708,619 | 1/1998 | Gillingham | 365/230.06 |
| 5,781,486 | 7/1998 | Meritt | 365/201 |
| 5,790,462 | 8/1998 | McClure | 365/200 |
| 5,809,225 | 9/1998 | Ohsawa et al. | 395/183.08 |

*Primary Examiner*—Viet Q. Nguyen
*Attorney, Agent, or Firm*—Dorsey & Whitney LLP

[57] ABSTRACT

During compression mode testing of a semiconductor memory device, a memory address is compressed to free up 2 or more bits in the address (e.g., an 11-bit address is compressed to 9-bits, freeing up 2 bits). Redundant element enable circuitry is coupled to one or more pins on a packaged chip that are unused during the compression mode testing. The circuitry receives control signals from external testing circuitry to select between the primary memory array in the chip, and redundant rows and columns of memory in the chip. As a result, during compressed address mode testing of the chip, a full 11-bit word is input to test the circuitry, but where 2 of the 11 bits allow the external circuitry to toggle between, and thereby selectively access, the rows and columns of primary and redundant memory in the chip. Alternatively, the circuitry can also be coupled to a non-connected pin on the packaged chip so as to operate during a non-compression mode testing.

3 Claims, 4 Drawing Sheets

APPARATUS FOR TESTING REDUNDANT ELEMENTS IN A PACKAGED SEMICONDUCTOR MEMORY DEVICE

CROSS-REFERENCE TO RELATED APPLICATIONS

This application is a Divisional of U.S. patent application Ser. No. 08/924,483, filed Aug. 18, 1997, now U.S. Pat. No. 5,978,289, which is a Divisional of U.S. patent application Ser. No. 08/633,133, filed Apr. 16, 1996, now U.S. Pat. No. 5,781,486, issued Jul. 14, 1998.

TECHNICAL FIELD

The present invention relates to apparatus and methods for testing semiconductor electrical devices, particularly memory devices.

BACKGROUND OF THE INVENTION

Testing is performed on semiconductor devices to locate defects and failures in such devices, typically occurring during the manufacture of the semiconductor devices. As circuit density on semiconductor devices increases, the number of defects and failures can increase. Semiconductor manufacturers, therefore, have an increasing need to detect defects and failures in semiconductor devices as circuit density increases.

Thus, for quality control and to improve yields of semiconductor devices, semiconductor devices are tested, often before a die containing the semiconductor device is packaged into a chip. A series of probes on a test station electrically contact pads on each die in a wafer to access portions of the individual semiconductor devices on the die. For example, in a semiconductor memory device, the probes contact address pads and data input/output pads to access selected memory cells in die memory device. Typical dynamic random access memory devices ("DRAM") include one or more arrays of memory cells that are each arranged in rows and columns. Each array of memory cells includes word or row lines that select memory cells along a selected row, and bit or column lines (or pairs of lines) that select individual memory cells along a row to read data from, or write data to, the cells in the selected row.

During testing, predetermined data or voltage values are typically written to selected row and column addresses that correspond to certain memory cells, and then the voltage values are read from those memory cells to determine if the read data matches the data written to those addresses. If the read data does not match the written data, then the memory cells at the selected addresses likely contain defects and the semiconductor device fails the test.

Nearly all semiconductor devices, particularly memory devices, include redundant circuitry on the semiconductor device that can be employed to compensate for certain detected failures. As a result, by enabling such redundant circuitry, the device need not be discarded even if it fails a particular test. For example, memory devices typically employ redundant rows and columns of memory cells so that if a memory cell in a column or row of the primary memory array is defective, then an entire row or column of redundant memory cells can be substituted therefor, respectively.

Substitution of one of the spare rows or columns is conventionally accomplished by opening fuses (or closing antifuses) in a row or column decoder on the die. Conventional fuses include polysilicon fuses which can be opened by a laser beam, and also avalanche-type fuses and antifuses. If a given row or column in the array contains a defective memory cell, then the wafer can be moved to another station where a laser blows a fuse to enable a redundant row or column. The redundant row or column is then accessed simply providing the address to a row of address decoder that substitutes the appropriate redundant row/column for the defective row or column in the primary memory array.

The rows and columns of redundant memory cells, as well as the primary memory cells, must be tested. During the testing process, additional pads are provided on the die so that probes on the test station can write data to and read data from these redundant rows and columns.

A semiconductor device can be most thoroughly tested when the device is still in die form on the semiconductor wafer. The series of tests performed on the semiconductor device while in die form are typically performed in a sequential manner where initial tests attempt to weed out dies that may fail under future tests. These dies are typically discarded as being fatally defective at an early stage because it is time-intensive, and therefore expensive, to thoroughly test such dies if initial test results of the die conclude that the device will likely fail. Furthermore, it is even more expensive to prepare and package a die into a chip. As a result, it is desirable to determine at an early stage which dies will fail as acceptable packaged chips.

For example, if the test of the die shows that some of the redundant rows and columns contain defects, then the die may be discarded since more thorough testing downstream may indicate failures for which an insufficient number of redundant elements can be employed. Therefore, the decision is made to mark a given die as defective, and therefore not incur the expense of preparing, packaging and testing the chip which will likely fail during downstream testing. A small margin of devices, however, could pass future tests, and therefore be commercially acceptable (e.g., only a few defects on the device are discovered and therefore only a few redundant rows/columns are necessary). Therefore, it would be desirable to package and test nearly every die to thereby produce a greater number of commercially acceptable chips. However, packaged chips cannot be as thoroughly tested as unpackaged dies in wafer form. Therefore, it would be desirable to be able to fully test packaged chips in the same manner as unpackaged dies.

Another drawback of testing semiconductors in wafer form is that semiconductor wafers are often difficult to manipulate, and typically require a test bed or other apparatus to releasably secure the wafer while the probes are moved to contact the pads on each die. Additionally, moving the wafer from one test station to another (e.g., to a second station having a laser for blowing fuses), adds to die time-consuming nature of testing semiconductor devices in die form. Overall, the testing of semiconductor devices in die form is time consuming. Therefore, semiconductor manufacturers desire to test a given semiconductor device after it has been packaged as a semiconductor chip, because the chip can be automatically inserted into a test socket using pick and place machinery. Automated testing circuitry can then apply predetermined voltages and signals to the chip, write test patterns thereto, and analyze the results therefrom to detect for failures in the chip.

Often, the number of pads on a die is greater than the number of pins on the packaged semiconductor chip. Therefore, as noted above, certain tests performed while the semiconductor device is in die form cannot be performed on the device after it has been packaged. For example, redundant rows/columns can be directly accessed when the device is in die form, but not when packaged into a chip. As a result, packaged chips necessarily undergo less rigorous testing than unpackaged dies. Packaged chips can include manufacturing defects that are not yet failures and thus are undetectable by the limited number of tests capable of being performed on the packaged chips.

To provide for rapid testing of chips, and to compensate for the limitation on the number of pads accessible in a packaged chip, manufacturers currently employ on chip test mode circuitry that initiates a special test mode when a predetermined combination of signals or "test key vector" signals are applied to the pins of the chip. For example, external test circuitry can force a low value to a write enable pin WE before signals applied to column address select ("CAS") pin and row address select ("RAS") pin fall to a low value. The test key vector signals applied to the pins are preferably selected to be signals not normally applied to such pins by a user under normal operation of the chip, and therefore, a user would not accidentally enter the test mode for the chip. To further ensure that a user does not accidentally enter into a test mode for the chip, a continuous supervoltage (e.g., 10 volts) must be applied to a pin on the chip to enter the test mode. Such a supervoltage is one beyond the normal tolerances for the chip and therefore would not normally be applied to the chip by a user under normal conditions.

For example, the redundant rows/columns can be accessed by applying a certain test key vector signal and a supervoltage to the chip, which allows the chip to enter into a particular test mode. The redundant rows and columns can then be tested while the die is in its packaged chip form, even though a particular pad on the die is not directly accessible.

While it is desirable to test the redundant rows and columns after the die has been packaged as a chip, the currently known methods for accessing and testing the redundant rows/columns is time-consuming. External testing circuitry, after accessing and testing the rows and columns of cells in the primary memory array, must apply a new test key vector signal and supervoltage of the chip to access the redundant rows and columns. The need to apply the test key vector signal and supervoltage adds additional steps during the testing process which necessarily increases the time required to test the chip.

Additionally, current memory devices divide the primary array of memory cells into sub-arrays, or blocks, so that only a portion of the memory need be energized in a given access, resulting in significant power reduction. As the number of sub-arrays or blocks increases, e.g., up to 16 or 32 blocks, each block typically includes its own redundant rows and columns. As a result, conventional testing of the redundant rows and columns requires the external testing circuitry to frequently enter into and out of the special test mode for accessing the various redundant rows/columns. In other words, the external test circuitry must frequently and repeatedly apply the test key vector signal and supervoltage for each redundant row and column in the multiple blocks, which thereby further increases the time-consumptive nature of such testing.

SUMMARY OF THE INVENTION

The present invention allows rows and columns of redundant elements in packaged semiconductor chips, such as DRAMs and other semiconductor memory devices, to rapidly undergo testing when in packaged form, where such testing previously had been available only under time-consuming processes. During testing, addresses are typically compressed or multiplexed so that a single address can access multiple locations in a memory array and thereby allow data to be written and read from multiple locations using a reduced size address word. As a result, where an 11-bit address word is typically required to access a particular memory cell in the array, under compression testing, only a 9- or 10-bit test address is used to access multiple memory cells. By employing a reduced bit address word, one or more address pins are unused during the compression testing.

A redundant element access circuit on the die with the memory device is coupled to the one or more unused address pins. The access circuit receives a control signal that allows external testing circuitry to select between the primary memory array and the redundant rows and columns. Therefore, during compressed address mode testing, a full 11-bit word is employed by the testing circuitry to test both the primary memory array and the redundant rows and columns, where two of the 11 bits select between the primary memory array and the redundant rows and/or columns, while the remaining bits are the typical compressed test address. No supervoltage or test key vector signal is required to initiate a new testing mode to access the redundant rows/columns. Rather, a simple address word, as is typically employed, is modified to access and thereby test the redundant rows and columns. As a result, the present invention allows both primary and redundant elements such as memory cells to be rapidly tested in a packaged chip. Since packaged chips can be tested in parallel, using automated equipment, as opposed to testing in die form, the present invention provides a tremendous time saving step during the testing of semiconductor devices.

In a broad sense, the present invention embodies a semiconductor device having a die and a plurality of terminals. The terminals include access terminals for receiving access signals. The semiconductor device includes a semiconductor circuit, control and access circuitry, and a redundant element access circuit.

The semiconductor circuit is formed on the die and has a plurality of primary circuit elements and a plurality of redundant circuit elements. The plurality of primary and at least some of the redundant circuit elements are addressable by electrically conductive lines based on an access word applied to the access terminals.

The control and access circuitry is coupled to the terminals and to the electrically conductive lines for permitting communication with the plurality of primary and redundant circuit elements. The redundant element access circuit is coupled to the control and access circuitry and to at least one of the access terminals. The redundant element access circuit receives an externally applied element select signal that is applied to the at least one of the access terminals. The redundant element access circuit outputs a redundant element select signal to allow the control and access circuitry to access at least one of the plurality of redundant elements in response thereto.

The present invention also embodies a computer system having an input device, an output device, an address bus, a data bus, a set of control lines, a memory controller, a processor, and a memory device. The memory controller is coupled to the address and data buses and to the set of control lines. Similarly, the processor is coupled to the input and output devices, and to the address and data buses and to the set of control lines. The memory device is coupled to the memory controller through the address and data buses and the set of control lines.

The memory device includes a memory circuit formed on a die having terminals including address terminals coupled to the address bus. The memory circuit has a plurality of primary memory cells and a plurality of redundant memory cells. The plurality of primary and at least some of the redundant memory cells are addressable by electrically conductive lines based on an address word applied to the address terminals. The address word has a predetermined bit length. Control and address circuitry is coupled to the terminals and to the electrically conductive lines for permitting communication with the plurality of primary and redundant memory cells. A redundant element access circuit is coupled to the control line address circuitry and to at least one of the address terminals, so as to receive an externally applied element select signal applied to the at least one of the address terminals. The redundant element access circuit outputs a redundant element access signal to allow the control address circuitry to access at least some of the plurality of redundant elements.

The present invention solves problems inherent in the prior art of semiconductor testing and provides additional benefits by allowing rapid testing to be performed on redundant elements in packaged semiconductor chips. As a result, the present invention avoids many of the drawbacks of testing unpackaged devices in die form. Other features and advantages of the present invention will become apparent from studying the following detailed description of the presently preferred embodiment, together with the following drawings.

DETAILED DESCRIPTION OF THE INVENTION

Figure 1:
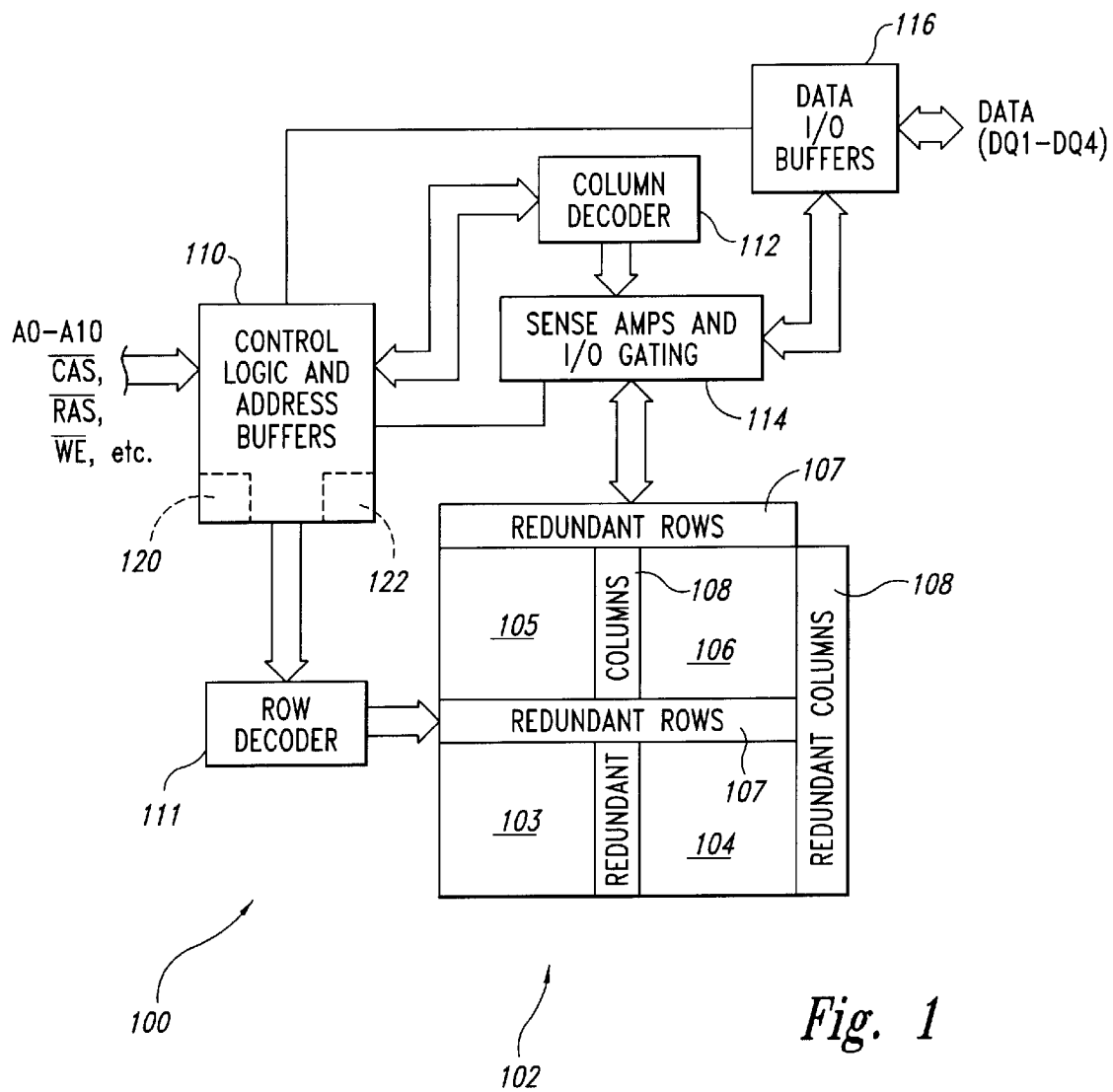
FIG. 1 is a block diagram of a semiconductor memory device under the present invention.

Referring to FIG. 1, a semiconductor device such as a memory device 100 includes one or more memory arrays 102 each having primary memory sub-arrays such as four sub-arrays 103, 104, 105 and 106. Each of the primary memory sub-arrays 103–106 have redundant rows 107 and redundant columns 108 of memory cells. As described above, the redundant rows and columns 107 and 108 are selectively enabled to replace defective rows or columns of memory cells, respectively, in the primary memory sub-arrays 103–106.

A control logic and address buffer 110 receives externally applied signals such as an 11-bit addresses word on address lines or pins A0–A10. The control logic and address buffer 110 also receives externally generated control signals such as column address strobe CAS, row address strobe RAS, write enable WE, and so forth, as is known by those skilled in the relevant art. When the control logic and address buffer 110 receives the addresses on address lines A0–A10, it buffers and latches the addresses, and outputs them to a row decoder 111 and column decoder 112. The row decoder 111 decodes the address and applies it to the memory array 102 to enable a selected row in the array, while the column decoder 112, through a sense amplifier and input/output gating circuit 114, enables one or more columns in the array. The sense amplifier and input/output gating circuit 114 senses a value on the one or more columns and outputs the data to a data input/output buffer 116, which in turn provides the data to data lines. The memory device 100 also includes a redundant element selector address circuit 120 and test mode circuitry 122 as part of the control logic and address buffer 110, as described more fully below.

The device 100 can be a 1 megabit by 4 semiconductor memory device having four memory cell arrays 102 (only one of which is shown in FIG. 1). Each memory cell array 102 is preferably subdivided into sub-arrays, for example, as shown by the four blocks 103–106. By dividing the memory into four arrays 102, data is multiplexed into the device 100 so that each memory array is addressed by its own data line, and therefore the device has four data lines DQ1–DQ4.

As is known in the art, during writing of data, 4-bits of test data is driven onto the data lines DQ1–DQ4 for storage in each of the corresponding memory arrays 102 based upon a logical address applied to the address pins A0–A10. The device 100 stores the 4-bits of the test data in at least one particular address memory location in four respective memory arrays 102. Since the device 100 is a 1 megabit by 4 memory device, 1,024 row lines and 1,024 column lines, are used to access over 1,000,000 memory cells in each of the four memory arrays 102. The control logic and address buffer 110, in response to the CAS, RAS, WE, and other control signals, operates the row decoder 111, column decoder 112, sense amps and I/O gating circuit 114, and data I/O buffers 116 to write data to, or read data from, the array 102. Additional description regarding writing data to, or reading data from, the memory device 100 is unnecessary, as such details are known to those skilled in the art.

Figure 2:
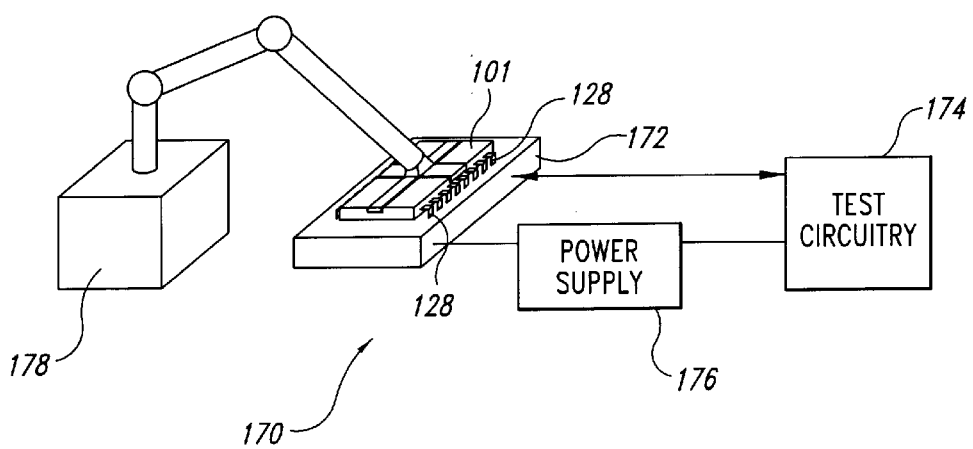
FIG. 2 is a partial isometric, partial block diagram of a testing station for testing a packaged semiconductor chip embodying the memory device of FIG. 1.

The memory array 102 (with redundant rows and columns 107 and 108) and the components 110–116 are monolithically formed on a substrate or die, which is encapsulated by a protective material, such as epoxy or plastic, to form a packaged chip 101 as shown in FIG. 2. Pins or leads 128 extending from the packaged chip 101 provide the terminals for the device 100 so that the addresses A0–A10, control signals CAS, RAS, WE, etc., can be applied to the control logic and address buffer 110, and data can be input to and output from the data input/output buffer 116 over the data lines DQ1–DQ4, as is known in the art. Additional pins provide power to the device 100.

A testing station 170 for testing the packaged chip 100 has a socket 172 for releasably holding the chip and providing electrical interconnection between the pins 128 and external test circuitry 174. An external power supply 176 coupled to the socket 172 and the test circuitry 174 provides external power to the chip 100. Conventional automated pick and place machinery 178 can manipulate the chip and insert it into the test socket 172 for testing it to even more rapidly test the device 100 than when it is in die form. The test circuitry 174 of the test station 170 preferably includes microprocessor or microcontroller circuitry and memory for performing test routines.

To access the rows and columns of memory cells in all of the four memory arrays 102, all eleven address pins 128, A0 through A10, on the packaged chip 101 are required. As noted above, however, during a compression test mode for the chip 101, address values are compressed or multiplexed to allow similar data to be written to multiple address locations in the memory arrays 102. By compressing address values and accessing, e.g., two sub-arrays 103 and 104 simultaneously, fewer addresses are required. As a result, only ten of the eleven address pins are required to access all of the rows 300. With such an arrangement, one of the eleven address pins is available for use for inputting an additional signal. If the four sub-arrays 103–106 are accessed simultaneously, only 9 of 11 address pins 128 are required to access all the memory cells, thereby freeing up 2 of the 11 address pins.

During testing of the chip 101, the external testing circuitry 174 causes the test mode circuitry 122 of the memory device 100 to enter into a test mode, and thereby allow the memory array 102 to be tested. For example, the external testing circuitry 174 applies a predetermined combination of signals to the WE, CAS, and RAS pins 128 (i.e., a test key vector signal), which are received by the test mode circuitry 122. In response thereto, the test mode circuitry 122 enters the memory device 100 into a compression test mode where preferably both row and column addresses are compressed. Under the compression test mode, a single data value is written to one memory cell in each of the four sub-arrays 103–106. Under normal operation, for example, the most significant bit in the 11-bit address typically selects between sub-arrays 103 and 104, while the second-most significant bit selects between sub-arrays 105 and 106. In compression test mode, however, the most and second-most significant bits are unused so that the remaining 9 bits in the address write a data value to all four sub-arrays 103–106. Address pins A10 (for the most significant bit) and A9 (for the second-most significant bit) are unused. As explained more fully below, the address pins A10 and A9 are then used as input terminals for the redundant element addressing circuit 120 to select between primary and redundant memory elements in the array 102.

During testing of the chip 101, the external circuitry 174 typically applies a known value to multiple memory cells in the array 102, such as in a checkerboard pattern. A compare circuit (not shown) in the external test circuitry 174 compares the written to value to the read from value to determine whether any errors, and thus failures, have occurred. Additional tests such as tinning, precharge, etc., are likewise performed on the chip 101. If additional tests are required, the external testing circuitry ceases to apply the supervoltage to the chip 100. In response thereto, the test mode circuitry 122 exits its current test mode, and returns the chip 100 to its normal operating mode. Thereafter, the external test circuitry can reapply the supervoltage, and apply another test key vector signal, to cause the test mode circuitry 122 to enter into a different test mode for the device 100.

Under the present invention, however, the external test circuitry 174 only initially applies a signal or a combination of signals to the device 100 to cause the test mode circuitry 122 to enter into the compression test mode (e.g., by applying a continuous supervoltage to one of the pins 128, and then applying a test key vector). The external test circuitry 174 thereafter applies a series of compressed address signals to the address pins A0–A8 to access selected memory cells in the array 102, and applies test data to the data pins DQ1–DQ4, which the device 100 writes to the appropriate locations. In addition, the external test circuitry 174 applies a test key signal to the A9 address pin 128 to select between the columns of primary or redundant memory cells, and applies a similar test key to the address pin A10 to select between rows of primary or redundant memory cells. In other words, the external test circuitry 174 applies a 0 or a 1 to the second-most significant bit address pin 128 (A9) of the chip 101 to cause the redundant element address circuit 120 to select between columns in the primary memory (sub-arrays 103–106) or redundant memory (108), respectively. Therefore, the external test circuitry 107 can apply a standard 11-bit address value to the address pin A0–A10 and simply select between primary and redundant memory by toggling between the most significant bit and second-most significant bit, without the need to stop a current testing mode, apply a supervoltage value and a new test key vector signal for a new test mode to test the redundant memory elements.

Figure 3:
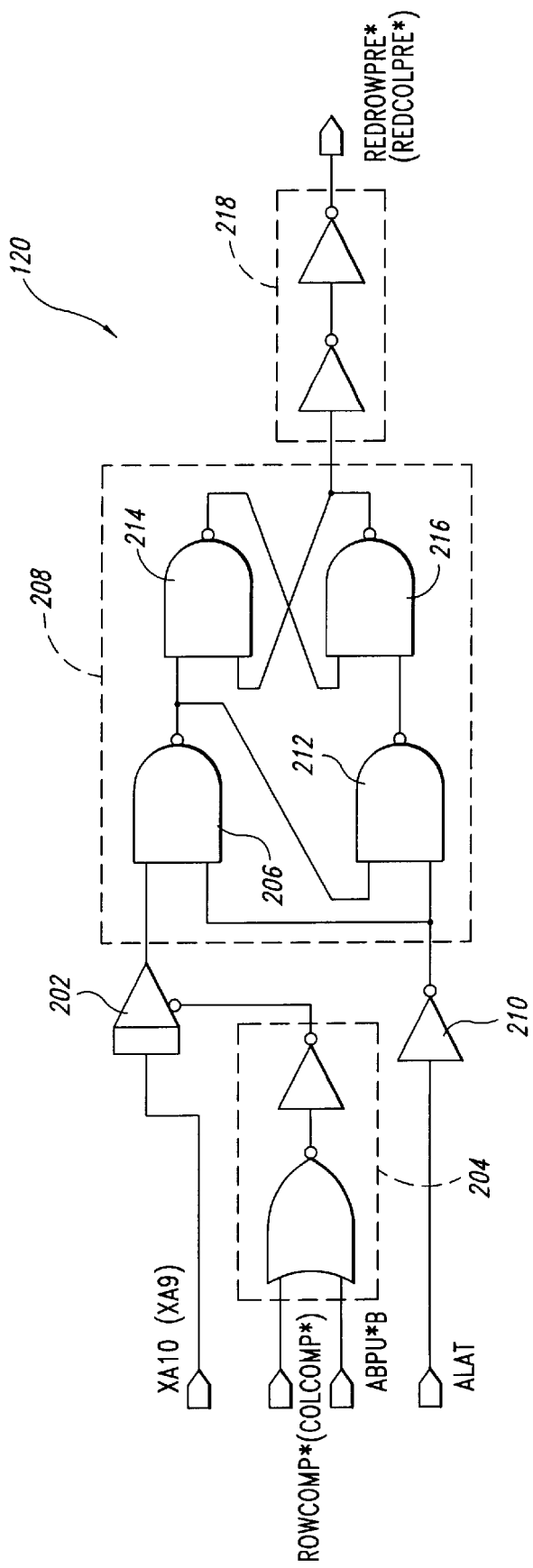
FIG. 3 is a schematic diagram of a redundant element enable circuit employed by the memory device of FIG. 1.

Referring to FIG. 3, exemplary redundant element address circuit 120 is shown as having an input buffer 202 that is coupled to the external address pin XA10 (where the "X" refers to an external pin 128). A two input OR gate 204, consisting of a NOR gate whose output is coupled to an inverter, receives at its first input a row compression signal ROWCOMP*, which is an enable signal generated by the test mode circuitry 122. (The "*" symbol, as used herein, generally refers to a signal whose active value is a logical low state.) When the test mode circuitry 122 receives the appropriate initializing test key vector signal at the beginning of a compressed test mode operation, the test mode circuitry continuously generates and applies the ROWCOMP* signal to the OR gate 204. A buffer power-up signal ABPU*B is applied to the second input of the OR gate 204 to power up the buffer 202. As explained below, the OR gate 204 acts as a pass gate so that it outputs a signal only when both input signals are at their active (i.e., low) value. For reasons of power conservation for the device 100, the ABPU*B signal is applied only when the RAS and CAS signals transition to their active states (e.g., fall to a low value) so that the buffer is not powered up unnecessarily when it is not needed.

A first two input NAND gate 206 in a latch 208 receives the output from the buffer 202. An address latch signal ALAT, generated by the control logic and address buffer 110, is inverted by an inverter 210 and input to the other input to the NAND gate 206. The inverted ALAT signal is also applied to a first input of a second two input NAND gate 212, while the output of the first NAND gate 206 is input to its second input. The NAND gates 206 and 212 act to trap the address signal from the input buffer 202 within the latch 208. A pair of cross-coupled NAND gates 214 and 216 (operating as a set-reset flip-flop) receive the output signals from the NAND gates 206 and 212. The output of the NAND gate 216 is then buffered by a buffer 218 (consisting of two serially connected inverters) and then output as a redundant row pretest signal REDROWPRE*. The output buffer 218 is used as a gain stage to increase the drive capability of the latch 208.

In operation, the address buffer power-up signal ABPU*B signal has a low value when RAS transitions to its active state (e.g., its low value), while the row compression signal ROWCOMP* has a constant low value when the test mode circuitry 122 enters the device 100 into its compression test mode. As a result, the OR gate 204 only outputs a low value when both the device 100 is in its row compression mode and when RAS transitions to its active state, which in turn causes the buffer 202 to power up and be enabled. Once the buffer 202 is enabled, a test key applied by the test circuitry 174 to the external address pin A10 is input to the latch 208, through the buffer 202. At this time ALAT is low, thereby enabling the NAND gates 206, 212. As a result, when XA10 goes high, the output of the NAND gate 206 goes low, thereby causing the output of the NAND gate 212 to go high. The low output of the NAND gate 206 causes the output of the NAND gate 214 to go high thereby causing the output of the NAND gate 216 to go low since the NAND gate 216 also receives a high from the NAND gate 212. A redundant row pretest signal the output REDROWPRE* is then output as a low value. Thus, REDROWPRE* goes low whenever XA10 goes high after the buffer 202 has been enabled and ALAT is low When an address is latched in the memory device 100 (e.g., when RAS transitions), the control logic and address buffer circuitry 110 provides a high value for the ALAT signal to the latch 208, which traps the test key signal from the external address pin A10 in the latch. The value of XA10 is trapped in the latch 208 because if ALAT goes high, it is inverted and input as a low value to disable both of the NAND gates 206 and 212. As a result, the outputs of the NAND gates 206 and 212 cannot go low, despite changes in XA10. By trapping the A10 signal in the latch 208, by means of a high ALAT signal, the A10 signal may thereafter fluctuate without changing the value previously trapped in the latch. While the output of the NAND gate 206 goes high when ALAT goes high, the other input to the NAND gate 214 of the flip-flop is low, therefore, the NAND gate 214 still outputs a high value. Consequently, the output REDROW-PRE* of the flip-flop (NAND gates 214 and 216) does not change when ALAT goes high because the two inputs to the NAND gate 216 remain high.

Once the latch 208 is set by the address A10 and trapped therein by the address latch signal ALAT, the latch outputs a logical low value, buffered by the buffer 208, as the redundant row pretest signal REDROWPRE*, assuming the A10 test key signal input has a high value. The redundant row pretest signal REDROWPRE* is then applied to the row decoder 111, together with an externally applied address from the test circuitry 174, to access one or more memory cells in the redundant rows 107. When ALAT returns to a low value, a high value is again input to the NAND gates 206 and 212, enabling these NAND gates. As a result, the latch 208 can reset when ALAT returns to a low value, allowing the address A10 to change the state of the latch 208.

Importantly, the test mode circuitry 122 need not enter into a new mode, and a new supervoltage need not be applied to the device 100. The external test circuitry 174 can rapidly and sequentially access both primary and redundant memory cells in the memory array 102 by simply applying the appropriate addresses to the address pins A0–A10, with the address applied to the pin A10 being essentially a test key signal that toggles between primary and redundant memory.

The circuit 120 of FIG. 3 is generally described above as selecting between rows of primary and redundant memory cells in the memory array 102. The device 100, however, includes a substantially identical circuit for accessing the redundant columns 108. Therefore, as shown in FIG. 3, to access the redundant columns, the external testing circuitry applies a signal to the external address pin XA9, which is input to the buffer 202, as shown in parentheses in FIG. 3. Likewise, the test mode circuitry 122 continuously applies a column compression signal COLCOMP* to the OR gate 204, and the ABPU*B signal during the active state for CAS. The redundant element address circuitry 120, for accessing columns, then outputs a redundant column pretest signal REDCOLPRE* as shown in FIG. 3, which is applied to the column decoder 112.

Without the need to wait to change test modes for testing primary and redundant memory, the present invention can test parameters of the device 100 which were previously unavailable to packaged chips 101. For example, by being able to rapidly and sequentially test primary and redundant memory cells, the test circuitry 174 can test the speed, refresh rate, timing and other aspects of the device 100 and thereby provide closer correlation of test results for primary and redundant memory in the device.

The present invention also allows for more thorough testing, including burn-in testing of the memory circuit 100. "Burn-in" testing refers to the process of accelerating failures in the memory circuit that occur during the infant mortality phase of the circuit's life to thereby remove inherently weaker circuits. "Infant mortality" refers to those memory circuits 100 that would fail early in their lives due to manufacturing defects. The burn-in process is performed on packaged chips, prior to their shipping to customers. The burn-in process is typically performed at a specified temperature and with specified voltage values for a specified period of time. The burn-in process is an automated process performed on the packaged chips, and therefore, the present invention is ideally suited for allowing the above-described testing to be performed on such chips during the burn-in process. As a result, the burn-in process can provide more effective testing of packaged chips before being deemed acceptable devices.

Figure 4:
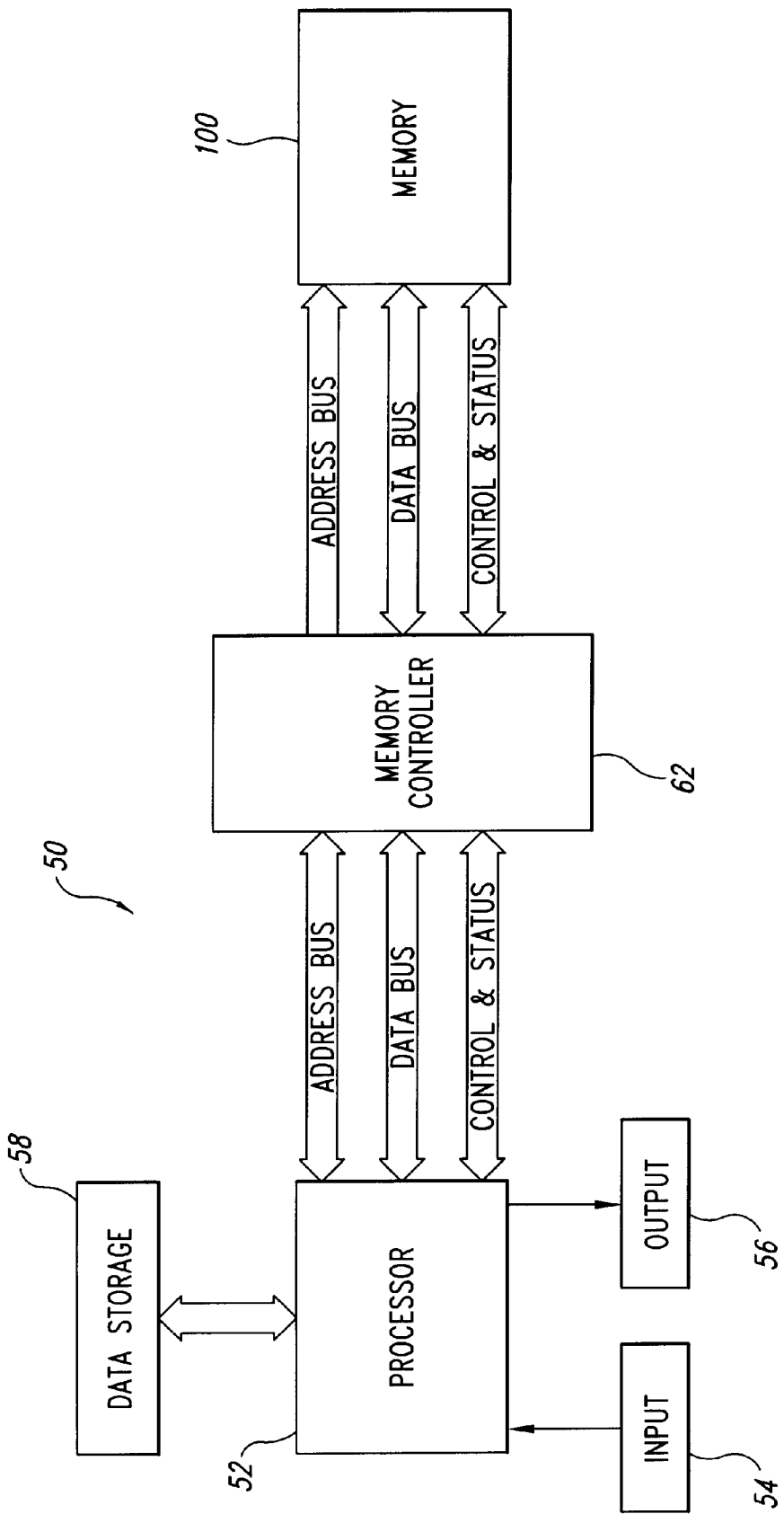
FIG. 4 is a block diagram of a computer system that incorporates the memory device of FIG. 1.

Since the device 100 can be efficiently and thoroughly tested while in its chip form, devices employing the chip 101 can benefit from the present invention. Referring to FIG. 4, a block diagram of a computer system 50 that uses one or more chips 101 embodying the memory device 100 is shown. The computer system 50 includes a processor 52 for performing computer functions, such as executing software to perform desired calculations and tasks. The processor 52 is connected to the one or more memory devices 100 through a memory controller 62 that provides the appropriate signals to the memory. One or more input devices 54, such as a keypad or a mouse, are coupled to the processor 50 and allow an operator (not shown) to input data thereto. One or more output devices 56 are coupled to the processor 52 to provide the operator with data generated by the processor 52. Examples of output devices 56 include a printer and a video display unit. One or more data storage devices 58 are coupled to the processor 52 to store data on or retrieve data from external storage media (not shown). Examples of storage devices 58 and corresponding storage media include drives for hard and floppy disks, tape cassettes, and compact disc read-only memories (CD-ROMs). Typically, the processor 50 generates the address signals A0–A10, control signals such as CAS, RAS, WE, etc., and the data DQ1–DQ4 that is written to the memory device 100, as shown by the address, data, control, and status buses, shown in FIG. 4.

Figure 5:
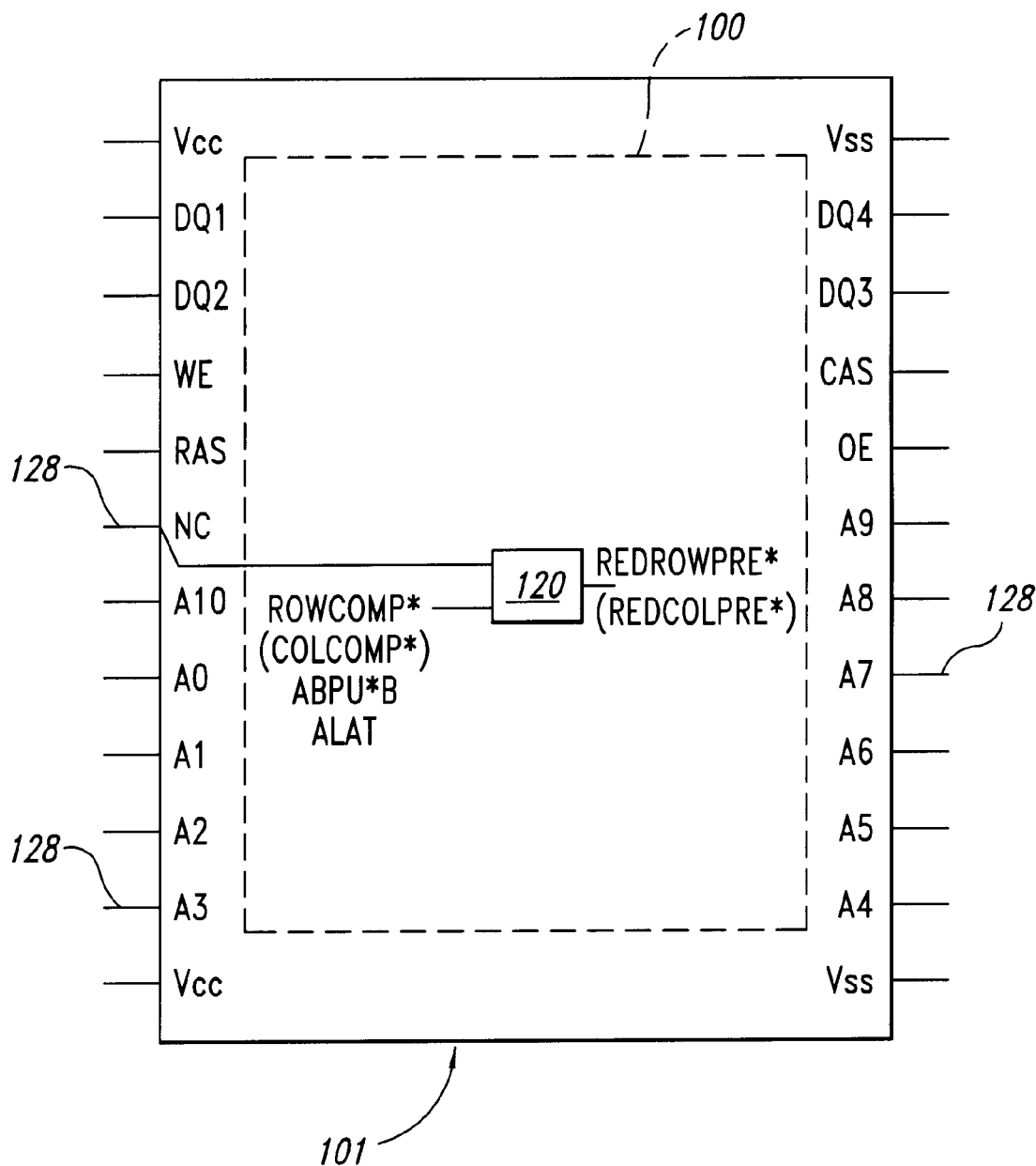
FIG. 5 is a block diagram of a packaged chip embodying an alternative embodiment of the present invention.

Referring to FIG. 5, in an alternative embodiment of the present invention, the redundant element addressing circuit 120 can be coupled to a non-connected (NC) or unused lead 128 on the packaged chip 101, instead of the external address pin A9 or A10. As a result, in the alternative embodiment of FIG. 5, the redundant element addressing circuit 120 can be operated even when the device 100 is not in a compression test mode. In such an alternative embodiment, the ROWCOMP* (or COLCOMP*) signals indicate redundant element test mode, rather than compression test mode.

The redundant element addressing circuit 120 is generally described above as employing inverters and NOR gates because the device 100 is preferably manufactured using conventional NMOS semiconductor manufacturing techniques. Other logic elements or manufacturing techniques can be substituted to perform the goals of the present invention, as is known by those skilled in the relevant art.

While the detailed description has been expressed, in part, in terms of specific examples, those skilled in the art will appreciate that many other variations could be used to accomplish the purpose of the disclosed invention. For example, those skilled in the art will recognize that while the device 100 is generally described above as being a DRAM memory device, the present invention is applicable to on-chip test circuitry in all memory devices, including high-speed memory devices such as synchronous DRAM or video or graphics memory (SVRAM and SGRAM), and extended data out, burst extended data out memory devices (EDO and BEDO).

Those skilled in the art will recognize that the present invention is also applicable to testing various types of semiconductor circuitry, either in die or packaged form. Additionally, the present invention is applicable to unpackaged dies in wafer form, known good dies, and multi-chip modules. Moreover, the present invention need not be limited to use during testing, but can be employed by the semiconductor circuitry to access portions of its redundant circuit elements, when necessary. Accordingly, it can be appreciated that equivalent modifications to the above-described embodiments can be made without departing from the spirit and scope of the invention. Therefore, the present invention is limited only by the following claims.

What is claimed is:

1. A method of testing a semiconductor memory device having primary and redundant memory elements and nodes electrically coupled thereto, including address nodes, the method comprising:

initiating a compressed address test mode for the semiconductor memory device;

externally applying a predetermined signal to at least one of the address nodes of the semiconductor memory device when the semiconductor memory device is in the compressed address test mode;

producing a redundant element select signal in response to the externally applied predetermined signal; and outputting data from at least one of the redundant memory elements in response to the select signal.

2. The method of claim 1 wherein outputting data includes receiving an access signal on at least some of the nodes, and accessing at least one of the redundant memory elements.

3. The method of claim 1, further comprising encapsulating the semiconductor memory device in an encapsulating material to form an automatically manipulatable packaged chip, and wherein the nodes are externally accessible from the packaged chip.

* * * * *

UNITED STATES PATENT AND TRADEMARK OFFICE
CERTIFICATE OF CORRECTION

PATENT NO.   : 6,118,711
DATED        : September 12, 2000
INVENTOR(S)  : Todd A. Merritt It is certified that error appears in the above-identified patent and that said Letters Patent is hereby corrected as shown below:

<u>Title page,</u>
Item [56], References Cited, U.S. PATENT DOCUMENTS, please add the following:

```
-- 5,473,198    12/1995    Hagiya et al.    257/786
   5,657,284    08/1997    Beffa            365/201
   5,777,932    07/1998    Chonan           365/201 --
```

Signed and Sealed this

Twentieth Day of August, 2002

Attest:

Attesting Officer

JAMES E. ROGAN
*Director of the United States Patent and Trademark Office*